United States Patent
Park et al.

(10) Patent No.: US 11,139,948 B2
(45) Date of Patent: Oct. 5, 2021

(54) AMI SYSTEM FOR PERFORMING PHASE DETECTION AND SYNCHRONIZATION IN AMI COMMUNICATION NETWORK USING RELAY COMMUNICATION METHOD, AND METHOD THEREOF

(71) Applicant: Korea Electric Power Corporation, Naju-si (KR)

(72) Inventors: Byung-Seok Park, Daejeon (KR); No-Gil Myoung, Daejeon (KR); Byung-Kab Jo, Gwangju (KR); Jong-Mock Baek, Naju-si (KR); Han-Jin Cho, Guri-si (KR); Jung-Ho Lee, Seoul (KR); Jun-Su Shim, Naju-si (KR)

(73) Assignee: KOREA ELECTRIC POWER CORPORATION, Naju-si (KR)

( * ) Notice: Subject to any disclaimer, the term of this patent is extended or adjusted under 35 U.S.C. 154(b) by 0 days.

(21) Appl. No.: 16/083,871

(22) PCT Filed: Jul. 13, 2017

(86) PCT No.: PCT/KR2017/007523
§ 371 (c)(1),
(2) Date: Sep. 10, 2018

(87) PCT Pub. No.: WO2018/230769
PCT Pub. Date: Dec. 20, 2018

(65) Prior Publication Data
US 2021/0184827 A1    Jun. 17, 2021

(30) Foreign Application Priority Data
Jun. 15, 2017   (KR) .................. 10-2017-0075705

(51) Int. Cl.
*H04L 7/00* (2006.01)

(52) U.S. Cl.
CPC .......... *H04L 7/0016* (2013.01); *H04L 7/0054* (2013.01)

(58) Field of Classification Search
CPC ....... H04L 7/0016; H04L 7/0054; H02H 3/24; H04Q 9/04; H02J 3/40; G01D 4/002
(Continued)

(56) References Cited

U.S. PATENT DOCUMENTS

| 4,499,534 A | * | 2/1985 | Schnetzka | H02M 7/1623 323/320 |
| 4,516,035 A | * | 5/1985 | Rhoads | H02H 3/24 307/66 |

(Continued)

FOREIGN PATENT DOCUMENTS

| JP | 2009176107 A | 8/2009 |
| KR | 20060051476 A | 5/2006 |

(Continued)

OTHER PUBLICATIONS

No-Gil Myoung, A Study on the Power Loss Monitoring Methods with AMI systems, 2013, p. 67-74, 27(8), Journal of the Korean Institute of Illuminating and Electrical nstallation Engineers, Seoul, Republic of Korea.

*Primary Examiner* — Phuong Phu
(74) *Attorney, Agent, or Firm* — Foundation Law Group, LLP

(57) ABSTRACT

The present invention relates to a system for performing phase detection and synchronization in an AMI communication network using a relay communication, and a method thereof. According to an embodiment of the present invention, a system for performing phase detection and synchronization in an AMI communication network using a relay communication includes an AMI server for collecting a 'reference zero-crossing detection (ZCD) time difference by phase' of input/output terminals of a main transformer (Continued)

installed in a substation; and a data concentration unit (DCU) comparing the 'reference ZCD time difference by phase' transmitted from the AMI server with a 'ZCD time difference by phase' collected by itself, and matching the same to have a time difference close to an error range.

13 Claims, 10 Drawing Sheets

(58) Field of Classification Search
USPC ................ 375/354, 371, 373, 375, 257, 258
See application file for complete search history.

(56) References Cited

U.S. PATENT DOCUMENTS

| | | | |
|---|---|---|---|
| 6,316,918 B1 * | 11/2001 | Underwood | H02J 3/40 322/20 |
| 2008/0077336 A1 * | 3/2008 | Fernandes | H04Q 9/04 702/57 |
| 2008/0279321 A1 * | 11/2008 | Bickel | G01D 4/002 375/356 |
| 2014/0207300 A1 | 7/2014 | Yun et al. | |

FOREIGN PATENT DOCUMENTS

| | | |
|---|---|---|
| KR | 100594778 B | 6/2006 |
| KR | 20120059868 A | 6/2012 |
| KR | 101538150 B | 7/2015 |
| KR | 20160127236 A | 11/2016 |

* cited by examiner

AMI SYSTEM FOR PERFORMING PHASE DETECTION AND SYNCHRONIZATION IN AMI COMMUNICATION NETWORK USING RELAY COMMUNICATION METHOD, AND METHOD THEREOF

TECHNICAL FIELD

The present invention relates to an AMI system for performing phase detection and synchronization in an AMI communication network using a relay communication method, and a method thereof. Particularly, the present invention relates to a system for performing phase detection and synchronization in an advance metering infrastructure (AMI) communication network using a relay communication method, and a method thereof, wherein an absolute electrical phase between a substation and a data concentration unit (DCU) in a wide area system is detected and synchronization is performed for the same, an absolute electrical phase between the DCU to which a relay transmission method is applied and a modem of a watt-hour meter of a sub-system is detected, and thus information of an electrical phase supplied from the substation to a final termination consumer is collected and synchronization is performed for the same.

BACKGROUND ART

In a power distribution system, when an electrical phase supplied to a consumer (load) is accurately detected, the load imbalance occurring between the three phases of supplied electricity can be minimized. This means that electric quality such as higher harmonics of a supplied voltage can be optimized. In addition, investment in power equipment can be efficiently performed and power supply loss due to the unbalanced current can be reduced.

In a low voltage power distribution system, a considerable number of consumers are connected to the distribution line. However, since the situation of consumers frequently changes due to events such as renovation of buildings, moving, new constructions and changes, accurately implementing information of an electrical phase supplied to the consumer is difficult.

Accordingly, in a conventional low voltage power distribution system, for phase detection and synchronization, a database is built with a single batch testing, and information of an electrical phase supplied to the consumer has been implemented by performing periodical re-test. However, such a method is not widely used since implementing a database with effectiveness is difficult since variability of a power distribution system frequently changes.

Meanwhile, a phase information detection apparatus detecting a phase of a line mixed within a line length of a transmission line or distribution line, and a method of detecting phase information using the same and a system thereof is disclosed in Korean Patent No. 594,778. In above Korean Patent No. 594,778, a number of sampling signals is collected by using a complicated DSP device and an AD converter for detecting a power phase, and a method for detecting a phases by using a high-speed program and processing algorithms are disclosed.

However, in Korean Patent No 594,778, it is assumed that a phase detection communication packet transmitted from a modem mounted or integrated in a watt-hour meter is directly transmitted to a DC without using a relay communication. Herein, practically, maintaining phase information is difficult as a modem functions as a relay communication by operating regardless of a power phase when a wireless method using a high frequency or a high speed broadband PLC method is used.

In addition, in Korean Patent No. 594.778, a phase is detected for a section below the DCU, and synchronization of an absolute phase of a wide area between a substation and the DCU is not disclosed.

Accordingly, in a power distribution system, there is need for providing a method of collecting, with minimum cost, phase information by using an AMI communication network using a relay communication method, frequently collecting phase information of a low voltage power distribution system and performing in semi real-time synchronization for the same, and collecting information of an absolute phase of a wide area and performing synchronization for the same.

DISCLOSURE

Technical Problem

An object of the present invention is to provide an AMI system for performing phase detection and synchronization in an AMI communication network using a relay communication method, and a method thereof, wherein since an absolute electrical phase between a substation and a DCU in a wide area system is detected and synchronization is performed for the same, an absolute electrical phase between the DCU to which a relay transmission method is applied and a modem of a watt-hour meter of a sub-system is detected, and thus information of an electrical phase supplied from the substation to a final termination consumer is collected and synchronization is performed for the same.

Technical Solution

According to an embodiment of the present invention, a system of performing phase detection and synchronization in an AMI communication network may include: an AMI server collecting a "reference zero-crossing detection (ZCD) time difference by phase" of input/output terminals of a main transformer installed in a substation; and a data concentration unit (DCU) comparing the "reference ZCD time difference by phase" transmitted from the AMI server with a "ZCD time difference by phase" collected by itself, and matching the same to have a time difference close to an error range.

The ZCD time difference may be determined by counting an interval between a "GPS PPS signal" that becomes a pulse counting basis, and a "ZCD pulse" as clock pulses.

The DCU may include: an oscillator unit generating a clock pulse; a GPS receiver unit determining a GPS pulse per second (PPS) signal from a received GPS signal; a ZCD circuit unit connected to a secondary side of a pole transformer, and determining a ZCD pulse by phase; and a pulse counting unit determining a ZCD time difference by phases by counting an interval between the GPS PPS signal and the ZCD pulse by phase as clock pulses.

The AMI server may collect the "ZCD time difference by phase" by using a reference phase detection unit connected to the input/output terminals of the main transformer installed in the substation.

The DCU may determine a phase of a master modem in a relay communication by using a ZCD time difference between phases on the basis of a ZCD point of a specific phase, and then determine a phase of a slave modem.

The DCU may determine the phase of the master modem which directly performs communication without using a relay modem, and determines phase information of the slave modem by using "phase information of the master modem" and a time difference calculated from a phase detection packet transmitted from the slave modem by the master modem.

The DCU may detect a phase of a modem by accumulating in manner that a ZCD signal is transmitted in a relay communication by using a ZCD time difference between phases on the basis of a ZCD point of a specific phase.

the modem may transmit an accumulated ZCD signal time difference of a previous section which is a result obtained by adding a ZCD signal time difference obtained by itself and a ZCD signal time difference of a slave modem.

The DCU may determine phase information of a termination modem by performing remainder arithmetic operation (MOD operation) that divides the accumulated ZCD signal time difference of the previous section transmitted from the modem by a total number of phases.

According to an embodiment of the present invention, a method of performing phase detection and synchronization in an AMI communication network may include: collecting, by an AMI server, a "ZCD time difference by phase" of input/output terminals of a main transformer installed in a substation; collecting, by a DCU, a "ZCD time difference by phase" of the same timing; and comparing, by the DCU, the "ZCD time difference by phase" transmitted from the AMI server with the "ZCD time difference by phase" collected by itself, and matching the same to have a time difference close to an error range.

According to an embodiment of the present invention, the method may further include: after the performing of the matching, determining, by the DCU, phase information of a master modem that is directly connected thereto without using a relay modem; and determining, by the DCU, phase information of a slave modem by using the "phase information of the master modem" and a time difference calculated from a phase detection packet transmitted from a slave modem by the master modem.

According to an embodiment of the present invention, the method may further include: after the performing of the matching, transmitting, by a modem, to a subsequent master modem an accumulated ZCD signal time difference of a previous section which is a result obtained by adding own ZCD signal time difference and a ZCD signal time difference of a slave modem; and determining, by the DCU, phase information of a termination modem by using the accumulated ZCD signal time difference of the previous section.

Advantageous Effects

In the present invention, since an absolute electrical phase between a substation and a DCU in a wide area system can be detected and synchronization can be performed for the same, an absolute electrical phase between the DCU to which a relay transmission method is applied and a modem of a watt-hour meter of a sub-system can be detected, and thus information of an electrical phase supplied from the substation to a final termination consumer can be collected and synchronization can be performed for the same.

In addition, the present invention provides a method of frequently collecting phase information of a low voltage power distribution system and performing in semi real-time synchronization for the same, and collecting information of an absolute phase of a wide area and performing synchronization for the same by introducing a function of collecting, with minimum cost, phase information by using an AMI communication network using a relay communication method.

In addition, in the present invention, phase information of a wide area can be synchronized by using a GPS signal and a ZCD signal, and a phase of a consumer can be detected in an expanded manner in an AMI system performing relay transmission based on the basis of above information.

In addition, in the present invention, an absolute electrical phase of a wide area system can be determined by using a single IPPS digital signal determined by receiving a GPS signal and a time difference between ZCD signals output from a ZCD circuit.

In addition, the present invention can be applied to all low-voltage consumers by supporting phase detection in a configuration where a number of watt-hour meters are connected to one modem and in a relay communication configuration.

In addition, the present invention can consistently manage a wide area phase of a nationwide substation and a power distribution line.

In addition, the present invention can easily manage electric conduction and leakage by phase by accurately determining a customer by phase of a transformer on a power distribution line.

In addition, the present invention can perform phase detection by adding a simple low cost part in an AMI mode and a DCU.

In addition, recently, the necessity of precise operation such as voltage management of the power system is rapidly increasing on the basis of the unlimited power system merging policy of distributed power source of 1 MW or less, the present invention can ensure phase consistency that is fundamental for phase detection and synchronization when collecting voltage, current, and power information.

BEST MODE

Figure 1:
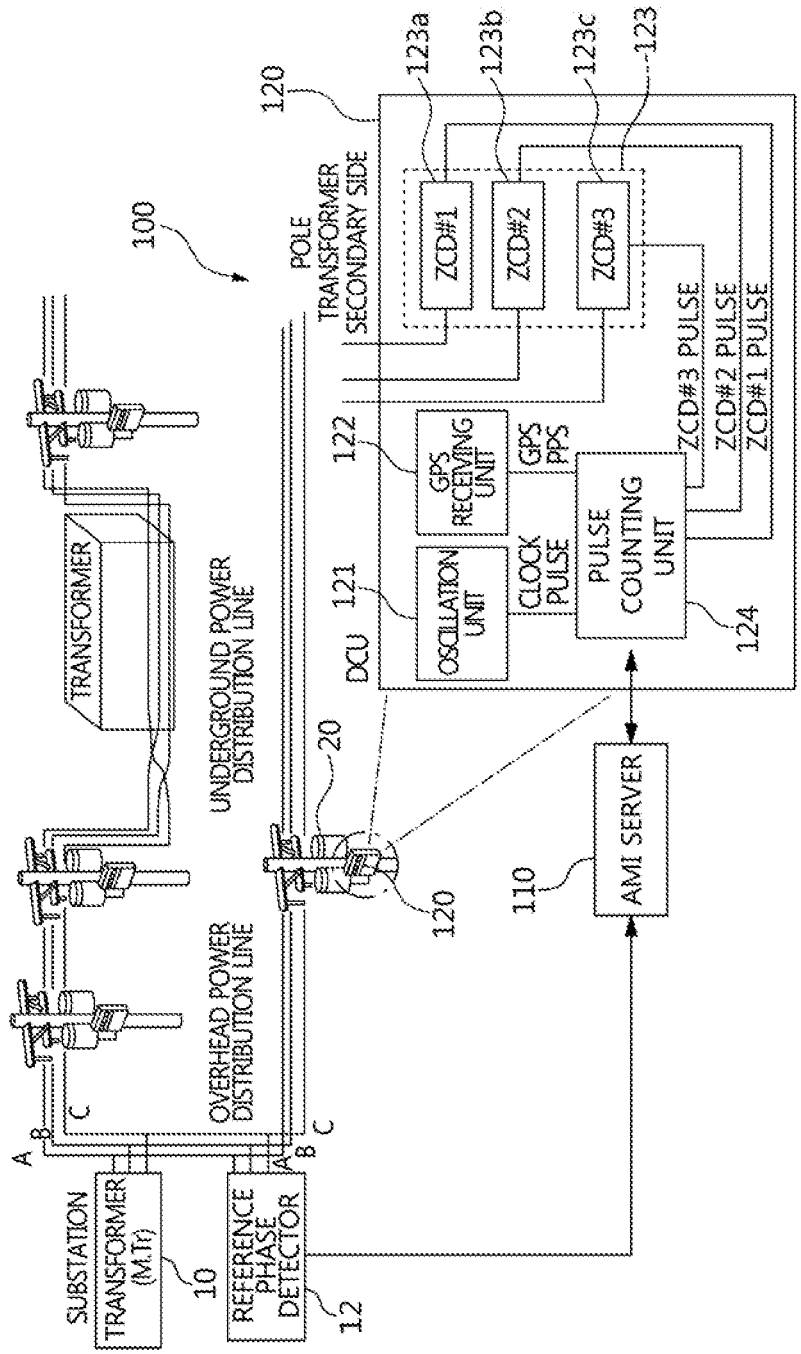
FIGS. 1 and 2 are views showing an AMI system performing a phase detection and synchronization in an AMI communication network using a relay communication method according to an embodiment of the present invention.

Hereinbelow, exemplary embodiments of the present invention will be described in detail with reference to the accompanying drawings. Throughout the drawings, the same reference numerals will refer to the same or like parts. It is to be understood that the present invention is not limited to the disclosed embodiments, but on the contrary, is intended to cover various modifications within the spirit and scope of the appended claims. The exemplary embodiments of the present invention are provided to fully describe the present invention to those skilled in the art. Therefore, the shapes of elements in the drawings may be exaggerated for clear description of the present invention. Detailed descriptions of known functions and configurations that unnecessarily obscure the subject matter of the present invention are omitted.

Figure 2:
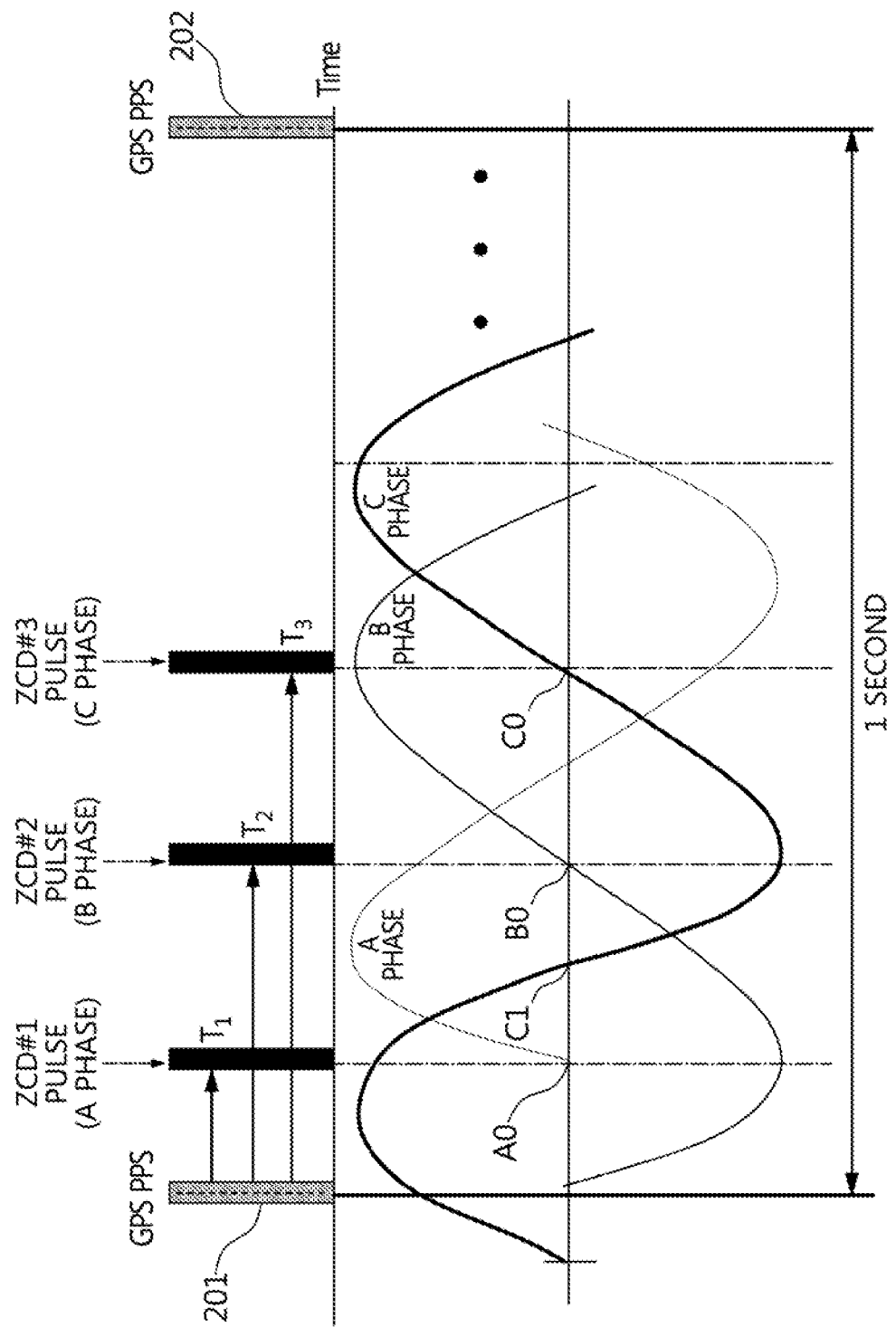

FIGS. 1 and 2 are views showing an AMI system performing a phase detection and synchronization in an AMI communication network using a relay communication method according to an embodiment of the present invention.

As shown in FIGS. 1 and 2, in an AMI system 100 performing phase detection and synchronization in an AMI communication network using a relay communication method according to an embodiment of the present invention (hereinafter, referred as "AMI system"), as a general configuration for a residential consumer, a watt-hour meter (not shown) and an AMI server 110 are connected by using a data concentration unit (hereinafter, referred as 'DCU') 120. The DCU 120 is connected to the watt-hour meter as a near field communication section, and connected to the AMI server 110 as a long distance communication section.

Herein, when forming a near field communication section between the DCU 120 and the watt-hour meter by using a wired and wireless communication method, in order to overcome an output restriction regulation, a relay transmission method or a mesh network method is used. Herein, the DCU 120 and the watt-hour meter include a near field communication modem.

Meanwhile, the AMI system 100 detects an absolute electrical phase and performs synchronization between a substation and the DCU 120 in wide area system, detects an absolute electrical phase between the modems of the DCU 120 and the watt-hour meter to which a relay communication method is applied of a sub-system, and thus may collect electrical phase information supplied from the substation to the end consumer.

Hereinafter, a process of synchronizing an absolute electrical phase between the substation and the DCU 120 in the AMI system 100 within wide area system will be described.

For helpful understanding, configuration elements for collecting a "zero-crossing detection (ZCD) time difference by phase" in the DCU 120 will be described first with reference to FIGS. 1 and 2.

The DCU 120 includes an oscillator unit 121, a GPS receiver unit 122, a ZCD circuit unit 123, and a pulse counting unit 124.

The oscillator unit 121 generates a clock pulse used for signal processing in the pulse counting unit 124, and inputs the same to the pulse counting unit 124.

The GPS receiver unit 122 receives a GPS signal and transfers a 1 pulse per second (PPS) signal (that is, a GPS PPS signal) that is determined from a GPS signal to the pulse counting unit 124.

The ZCD circuit unit 123 includes a zero potential detection circuit provided in each electrical phase of a secondary side of a pole transformer, and being capable of specifying an electrical phase (hereinafter, referred as "ZCD circuit"). The ZCD circuit unit 123 transfers a ZCD pulse by phase to the pulse counting unit 124.

Herein, for convenience of explanation, electrical phases from the first line to the third line are assumed to be an "A phase", a "B phase", and a "C phase", respectively.

A ZCD circuit provided in the first line is ZCD #1 123a and transfers a ZCD #1 pulse that is a ZCD pulse of the A phase to the pulse counting unit 124, a ZCD circuit provided in the second line is a ZCD #2 123b and transfers a ZCD #2 pulse that is a ZCD pulse of the B phase to the pulse counting unit 124, and a ZCD circuit provided in the third line is a ZCD #3 123c and transfers a ZCD #1 pulse that is a ZCD pulse of the C phase to the pulse counting unit 124.

The pulse counting unit 124 counts an interval between a "GPS PPS signal" that becomes a pulse counting basis and a "ZCD pulse" by phase as clock pulses, and determines a ZCD time difference. Accordingly, the pulse counting unit 124 collects a "ZCD time difference by phase" corresponding to a number of clock pulses by phase.

Referring to FIG. 2, a GPS PPS signal is shown as a reference GPS PPS 201 that becomes a pulse counting basis, and a subsequent GPS PPS 202 is shown next to the reference GPS PPS 201. The reference GPS PPS 201 and the subsequent GPS PPS 202 are shown in pulses with 1 second interval according to a time axis.

ZCD pulses are shown as a pulse corresponding to a zero cross detection point of each phase with 1 second interval between the GPS PPS 201 and the following GPS PPS 202 according to a time axis.

Herein, a zero cross detection point of each phase which is shown in a sine wave becomes a starting point of a sine wave. In the A phase, a point of "A0" becomes a starting point of a sine wave, in the B phase, a point of "B0" becomes a starting point of a sine wave, and in the C phase, a point of "C0" becomes a starting point of a sine wave. Herein, in the C phase, a point of "C1" does not correspond to a starting point of a sine wave, thus it does not correspond to a zero cross detection point of the C phase.

Accordingly, the ZCD pulse of the A phase (ZCD #1 pulse) represents a time difference "T1" from the reference GPS PPS 201 according to a time axis, the ZCD pulse of the B phase (ZCD #2 pulse) represents a time difference "T2" from the reference GPS PPS 201 according to a time axis, and the ZCD pulse of the C phase (ZCD #3 pulse) represents a time difference "T3" from the reference GPS PPS 201 according to a time axis.

As described above, a "clock pulse" is input from the oscillator unit 121, a "GPS PPS pulse" is transferred from the GPS receiver unit 122, and a "ZCD pulse" is transferred from the ZCD circuit unit 123. The ZCD pulse is collected from ZCD #1 to ZCD #3 123a to 123c which are a ZCD circuit provided in each phase of the ZCD circuit unit 123. The ZCD circuit may be configured by using low-cost electronic elements (diodes, resistors, photocouplers), and may be integrated in the watt-hour meter or modem. The ZCD circuit may be provided from Metering IC Corporation when a zero potential signal is supported in the watt-hour meter.

Then, a process of performing synchronization of an absolute electrical phase between the substation and the DCU 120 in wide area system will be described.

The DCU 120 is installed in a pole transformer 20 connected to a distribution line identical to input/output terminals of the main transformer 10 that is installed in the substation, and performs synchronization of an absolute electrical phase in wide area system by matching with phases of the input/output terminals of a corresponding main transformer 10.

For this, the AMI server 110 collects a "reference ZCD time difference by phase" of the main transformer 10 installed in the substation. Herein, the AMI server 110 collects the "reference ZCD time difference in phase" by using a reference phase detection unit 12 connected to input/output terminals of a corresponding main transformer 10. The reference phase detection unit 12 may use a process of collecting, by the DCU 120 a "ZCD time difference by phase" on the basis of a GPS PPS signal described above.

Then, the AMI server 110 transmits the collected "reference ZCD time difference by phase" to the DCU 120 installed in the same distribution line.

Then, the DCU 120 compares the "reference ZCD time difference by phase" transmitted from the AMI server 110 with 'ZCD time difference by phase' collected by itself of the same timing, and matches the 'ZCD time difference by phase' collected by itself with the transmitted "reference ZCD time difference by phase" to have a phase having a time difference close to an error range. As described above, ZCD time differences collected by the DCU 120 and the reference phase detection unit 12 are determined to have the same power phase when they are within a certain range through comparison.

In addition, the AMI server 110 may manage the ZCD time difference by phase by receiving the same from the DCU 120.

Figure 3:
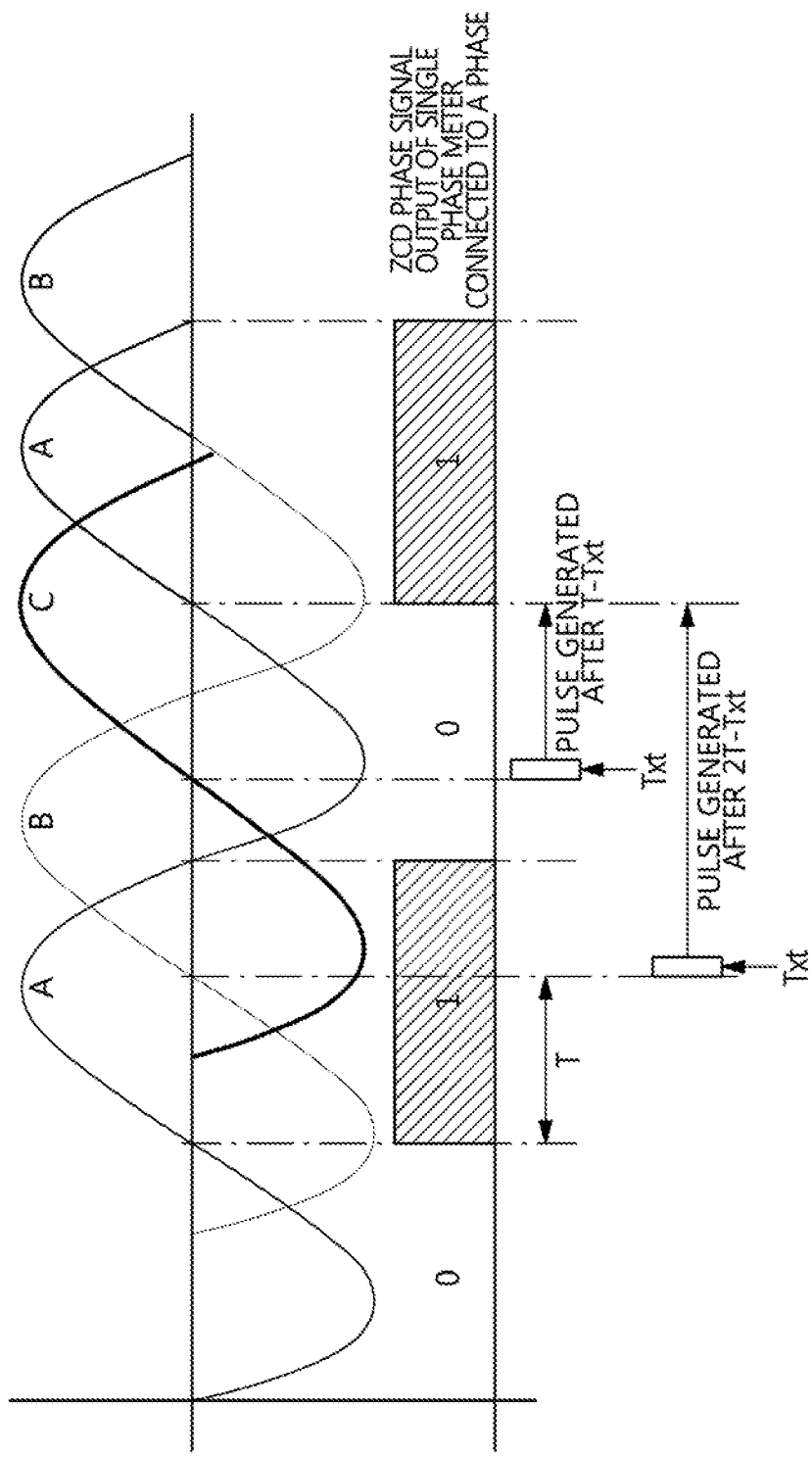
FIGS. 3 to 5 are views showing a zero potential crossing time between phases.
Figure 4:
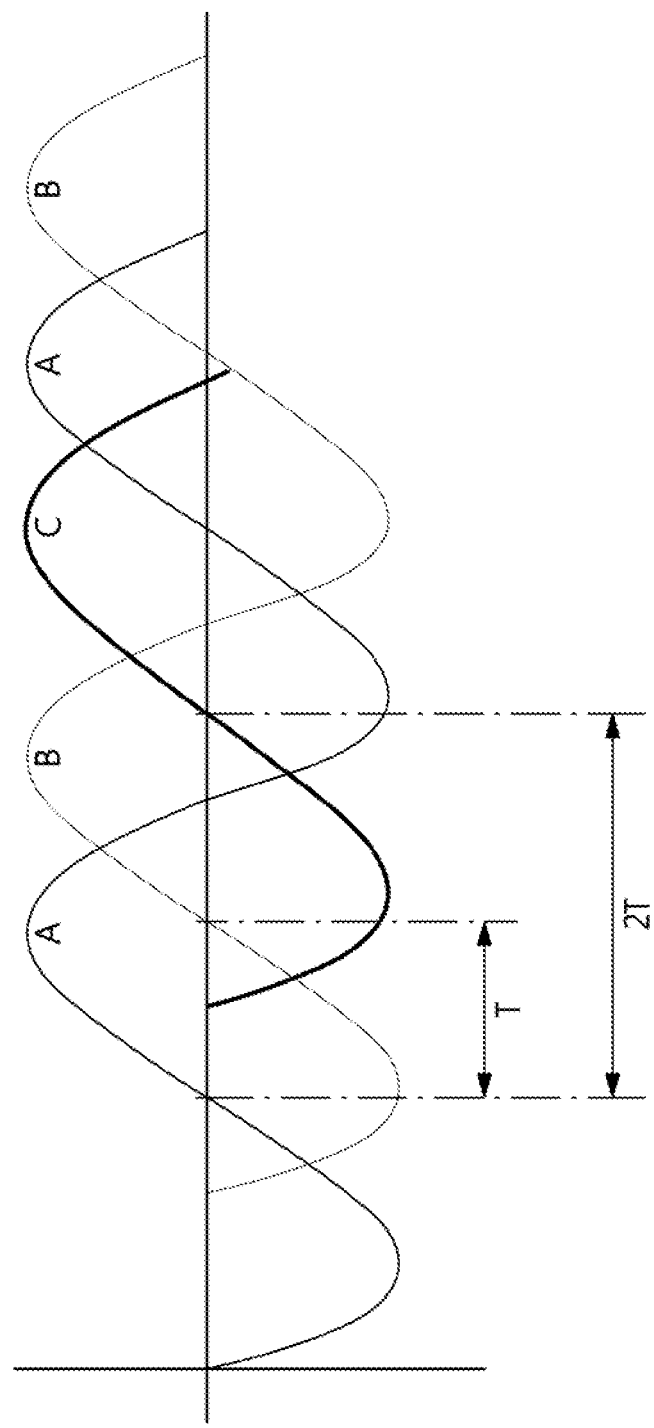
Figure 5:
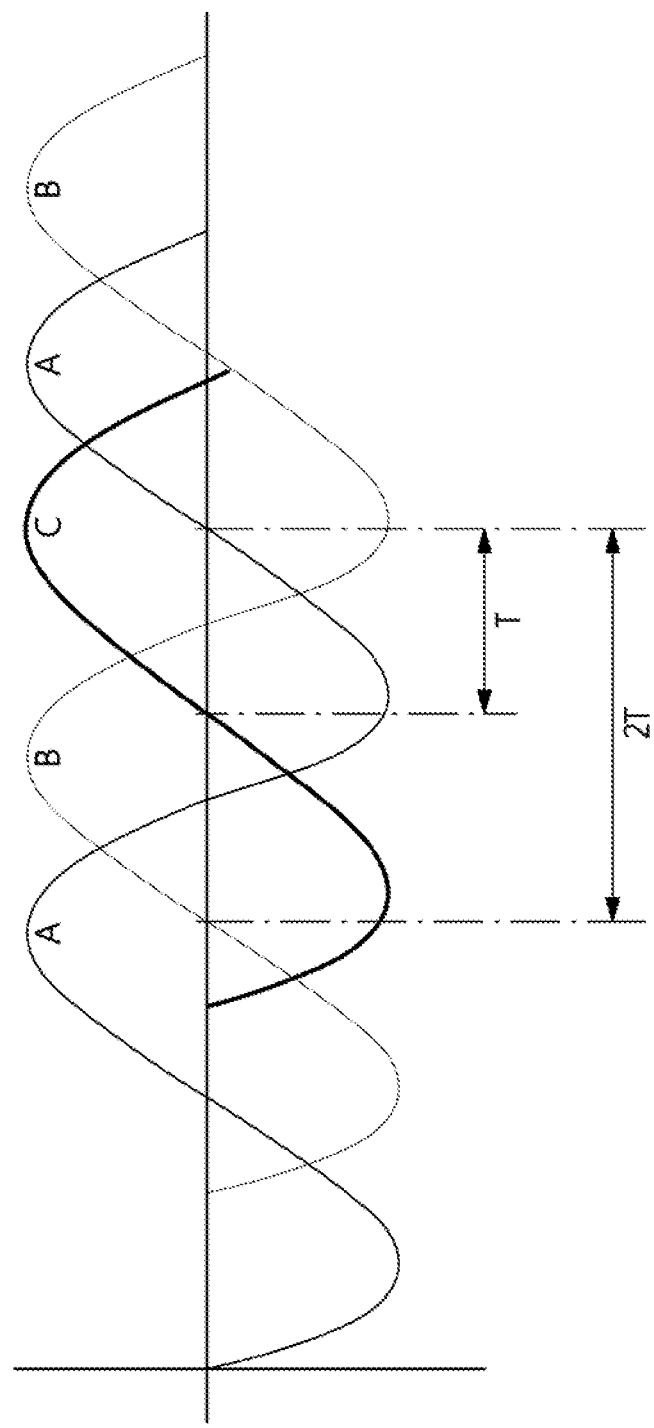

FIGS. 3 to 5 are views showing a zero potential crossing time between phases.

Referring to FIG. 3, based on a ZCD signal of a single phase watt-hour meter of an A phase, when a time difference of a ZCD between the A phase and a B phase (in other words, ZCD signal time difference) is "T", a time difference of a ZCD point between the A phase and a C phase becomes "2T" that is twice than "T".

Specifically, an error time "Txt" due to an occurrence of a ZCD pulse may be reflected in a time difference of a ZCD point between phases. Herein, "Txt" is much smaller than T. Since the "Txt" is determined in advance, arithmetic compensation is possible.

Referring to FIG. 4, when a transmitter is based on an A phase, a phase having a time difference of a ZCD point of "1T" becomes a B phase, and a phase having a time difference of a ZCD point of "2T" becomes a C phase.

Referring to FIG. 5, when a receiver is based on an A phase, a phase having a time difference of a ZCD point of "1T" becomes a C phase, and a phase having a time difference of a ZCD point of "2T" becomes a B phase.

Based on FIGS. 4 and 5, ZCD time differences between phases for all phases are represented as [Table 1] below. The DCU 120 determines a phase between modems by using a ZCD time difference between phases on the basis of a zero potential crossing point of a specific phase as [Table 1] below. This will be described later with reference to FIGS. 3 and 8 in detail.

TABLE 1

| Section | | Receiver | | |
|---|---|---|---|---|
| | | A phase | B phase | C phase |
| Transmitter | A phase | 0 | 1T | 2T |
| | B phase | 2T | 0 | 1T |
| | C phase | 1T | 2T | 0 |

Figure 6:
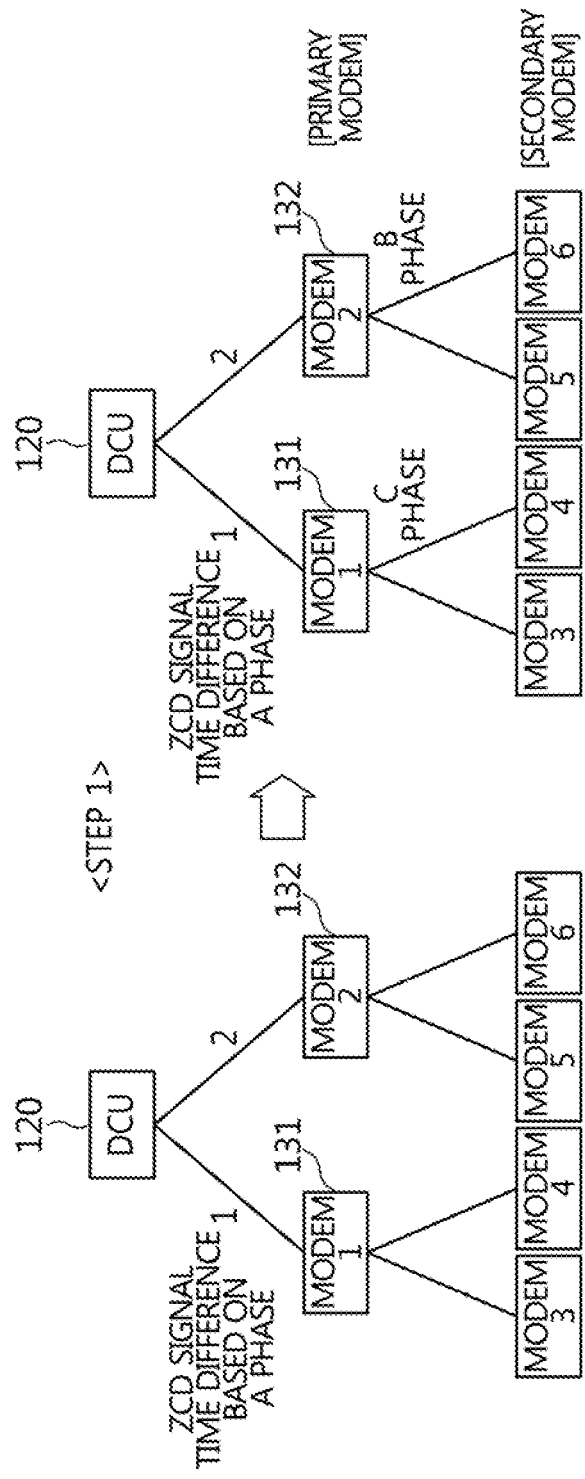
FIGS. 6 and 7 are views showing a method of detecting a phase of a modem by a DCU according to an embodiment of the present invention.
Figure 7:
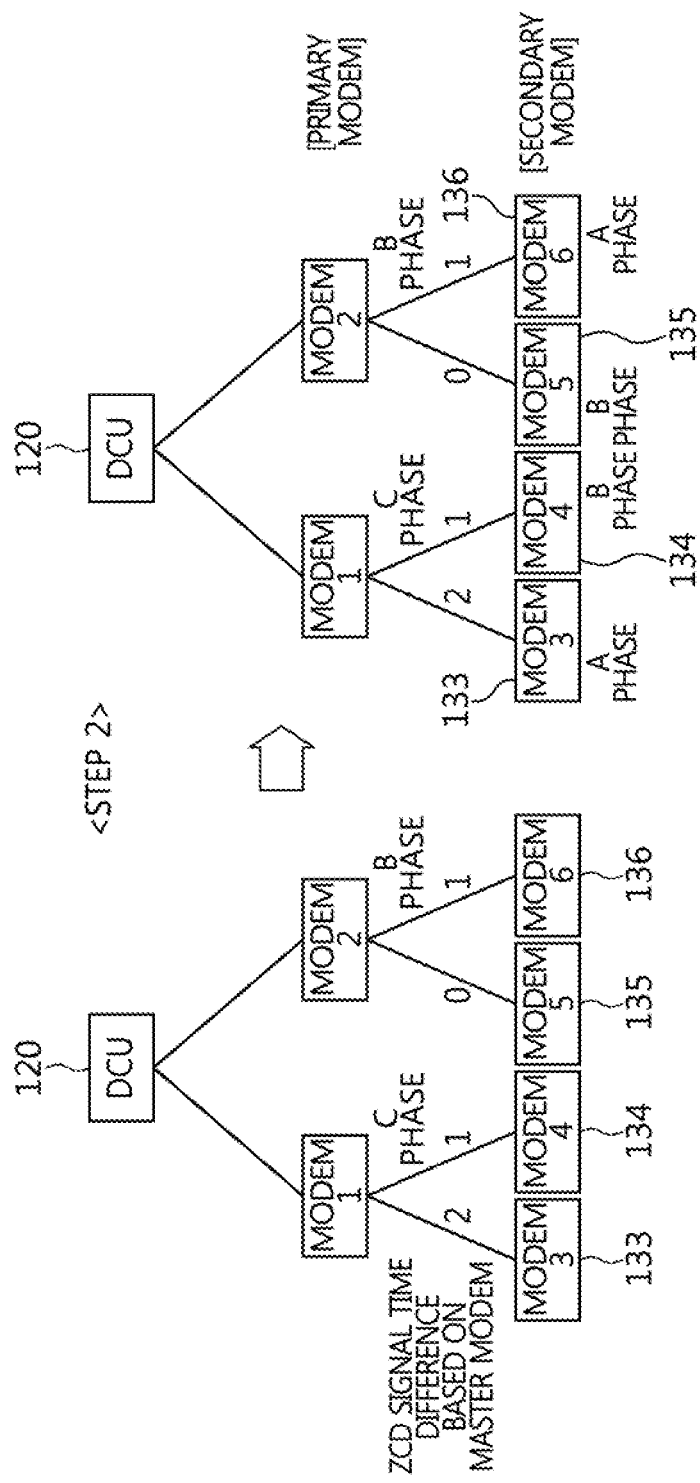

FIGS. 6 and 7 are views showing a method of detecting a phase of a modem by the DCU in a relay communication according to an embodiment of the present invention.

According to an embodiment of the present invention, when detecting a phase of a modem in a relay communication, the DCU 120 determines a phase of a master modem by using a ZCD time difference between phases on the basis of a ZCD point of a specific phase in [Table 1], and then determines a phase of a slave modem. As shown in FIGS. 6 and 7, the master modem may be represented as a primary modem, and the slave modem as a secondary modem. The above method is suitable for a system where phase information and communication of an application layer are in a de-concentrated manner.

Referring to FIG. 6, the DCU 120 determines phases of primary modems 131 and 132. Herein, the primary modems 131 and 132 mean a modem directly communicating with the DCU 120 without a relay modem, and a first modem 131 and a second modem 132 are included. However, the primary modems 131 and 132 correspond to a relay modem between the DCU 120 and secondary modems 133 to 136.

The DCU 120 determines phases of the primary modems 131 and 132, and transmits the determination result of the corresponding phases to the primary modems 131 and 132. Herein, the DCU 120 that is the receiver collects a ZCD signal time difference on the basis of an A phase. A ZCD signal time difference in the first modem 131 is "1T", and a ZCD signal time difference in the second modem 132 is "2T". By referring to [Table 1] above, the first modem 131 is determined to be a C phase, and the second modem 132 is determined as a B phase.

Referring to FIG. 7, the DCU 120 instructs the primary modems 131 and 132 to calculate phase information of the secondary modems 133 to 136. Herein, the primary modem 131 and 132 receive a phase detection packet or a pilot signal from the secondary modems 133 to 136.

In reference, the phase detection packet may be received within a time difference between electrical three phases which is 5.5 ms. In case of Korean high speed PLC, it takes about 0.3 ms when transmitting and receiving a short packet between two modems at a maximum velocity, and about 2.1 ms at a minimum velocity.

The DCU 120 determines phase information of the secondary modems 133 to 136 by using phase information of the primary modems 131 and 132 and time differences calculated by the secondary modems 133 and 136.

Herein, the first modem 131 that is a receiver collects a ZCD signal time difference on the basis of a C phase, a ZCD signal time difference in the third modem 133 is "2T", and a ZCD signal time difference in the fourth modem 134 is "1T". By referencing to [Table 1], the third modem 133 is determined to be an A phase, and the fourth modem 134 is determined as a B phase.

Similarly, the second modem 132 that is a receiver collects a ZCD signal time difference on the basis of a B phase, a ZCD signal time difference in the fifth modem 135 is "0", and a ZCD signal time difference in the sixth modem 136 is "T". By referencing to [Table 1] above, the fifth modem 135 is determined as a B phase, and the sixth modem 136 is determined as an A phase.

Figure 8:
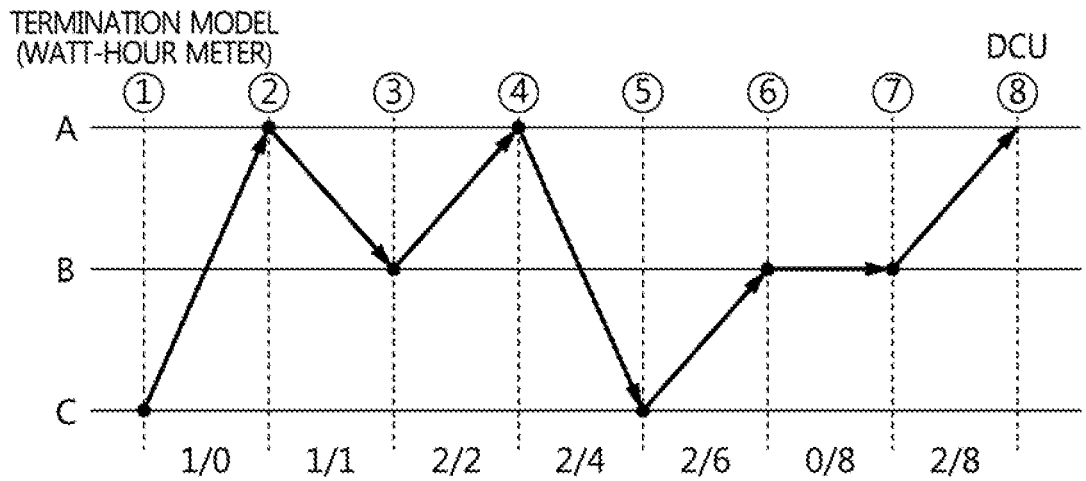
FIG. 8 is a view showing method of detecting a phase of a modem by a DCU according to another embodiment of the present invention.

FIG. 8 is a view showing a method of detecting a phase of a modem by the DCU in a relay communication according to another embodiment of the present invention.

According to another embodiment of the present invention, the DCU 120 detects a phase of a modem in a relay communication by accumulating in a manner that a ZCD signal is transmitted by using a ZCD time difference between phases based on a ZCD point of a specific phase of [Table 1] above. The above method is suitable for a system where phase information and communication of an application layer are in a concentrated manner.

In another embodiment of the present invention, different to the embodiment of the present invention, multiple modems have to operate at the same timing as all modems have to cooperate when starting and finishing transmission.

However, managing may be accurately performed since an error of phase information of a medium node is not spread on all lower nodes.

The DCU 120 may determine a phase of a termination modem (watt-hour meter) by accumulating a ZCD signal of a relay modem and a time difference of the secondary modem. In FIG. 8, modems correspond to ① to ⑦, and the DCU 120 corresponds to S.

Herein, the modem adds an accumulated ZCD signal time differences of a previous section with a ZCD signal time difference of a modem that is lower than itself, and transmits the same to a master model.

For example, in FIG. 8, '2/4' of a section between modems ④ and ⑤ may represent an accumulated ZCD signal time difference of a section of the corresponding modem as "2", and an accumulated ZCD signal time difference of a previous section as "4". Accordingly, the modem ⑤ measures a ZCD signal time difference of the corresponding modem section which is "2", and receives an accumulated ZCD signal time difference of a previous signal which is "4". Accordingly, the modem, ⑤ adds the value of "2" which is measured with the value of "4" which is received, and transmits the value of "6". As describe above, "6" transmitted by the modem ⑤ may represent "6" of the "2/6" of a section between the modems ⑤ and ⑥.

Meanwhile, the DCU 120 may determine phase information of the secondary modem which is transmitted from the termination modem by comparing the same with reference phase information.

For example, in FIG. 8, "2/8" of a section between the modems ⑦ and ⑧ may represent that modem ⑦ transmits "10" that is an accumulated ZCD signal time difference of a previous section to the DCU 120. Herein, the DCU 120 may determine, as below, phase information of a phase detection packet transmitted by the modem ① which is the termination modem by comparing with an A phase that is reference phase information In other words, as (2+8) MOD 3=1(multiple of T), by using a modulo (MOD) that is remainder arithmetic, as the remainder of dividing "10" which is the accumulated ZCD signal time difference of the previous section by "3" that is the total number of phases is "1", by referencing Table 1, when a receiver is based on an A phase, a phase having a ZCD signal time difference of "1T" is a C phase. Accordingly, the DCU 120 determines an electrical phase of the watt-hour meter (consumer) which is currently detected by the modem ① being the termination modem as a C phase.

Figure 9:
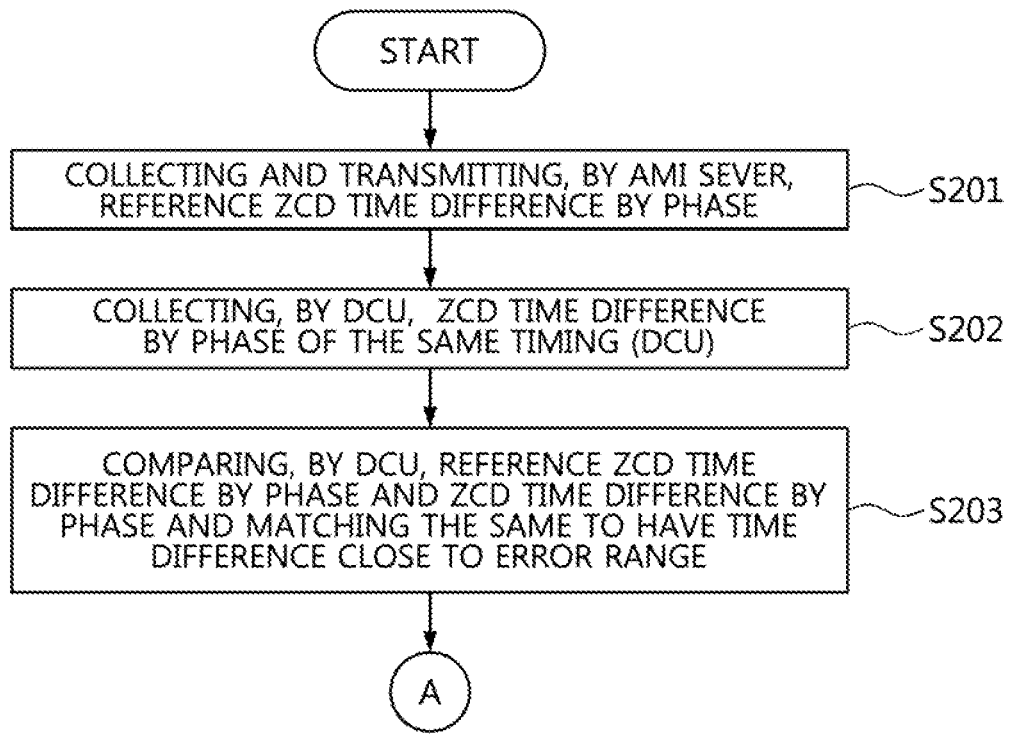
FIGS. 9 to 11 are views showing a method of performing a phase detection and synchronization in an AMI communication network using a relay communication method according to an embodiment of the present invention.
Figure 10:
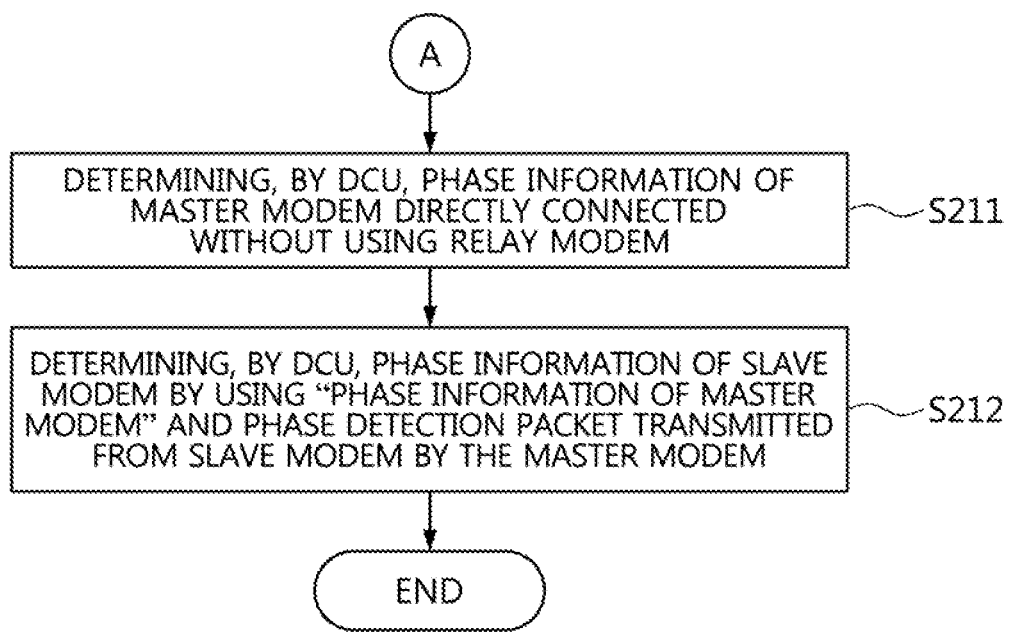
Figure 11:
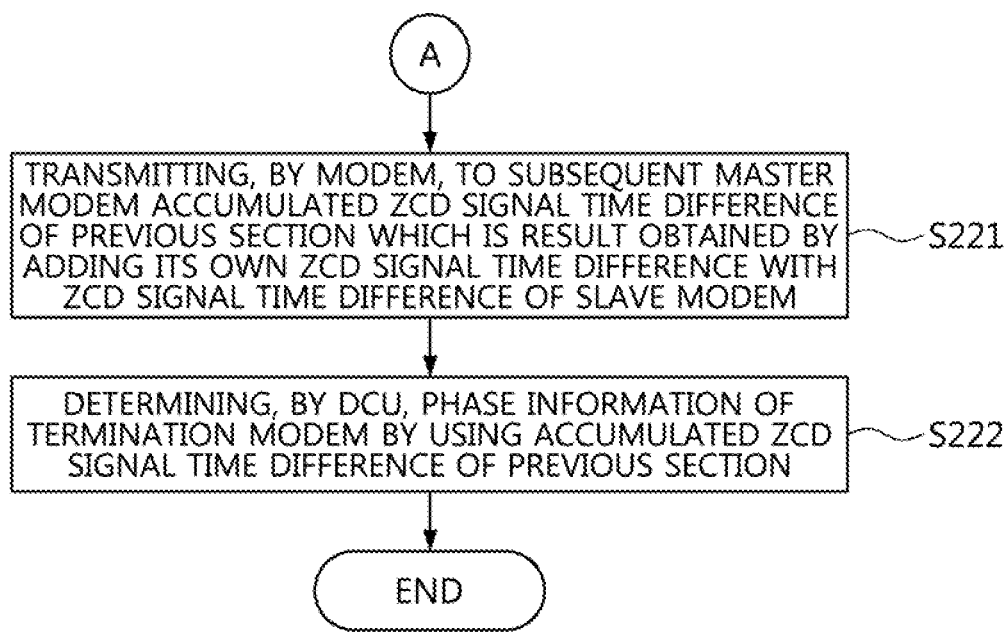

FIGS. 9 to 11 are views showing a method of performing phase detection and synchronization in an AMI communication network using a relay communication according to an embodiment of the present invention.

In step S201, the AMI server 110 collects a "ZCD time difference by phase" of input/output terminals of the main transformer 10 installed in the substation, and transmits the same to the DCU 120. Herein, in step S202, the DCU 120 collects "ZCD time difference by phase" of the same timing by itself.

Then, in step S203, the DCU 120 compares the "ZCD time difference by phase" transmitted from the AMI server 110 and "ZCD time difference by phase" collected by itself, and matches the same to have a time difference close to an error range.

Steps S201 to S203 described above are process of detecting an absolute electrical phase between the substation and the DCU 120 in a wide area system and performing synchronization for the same.

Hereinafter, a process of detecting an absolute electrical phase between the DCU 120 to which a relay transmission is applied, and a modem of the watt-hour meter of a sub-system will be described.

First, according to an embodiment, when detecting a phase of a modem in a relay communication, the DCU 120 determines a phase of a master modem by using a ZCD time difference between phases on the basis of a zero potential crossing point of a specific phase, and then determines a phase of a slave modem (Refer to FIG. 10).

In step S211, the DCU 120 determines phase information of the master modem which is directly connected without using a relay modem. Herein, the DCU 120 instructs the master modem to calculate phase information of the slave modem. Accordingly, the master modem receives a phase detection packet or pilot signal from the slave modem.

Then, in step S212, the DCU 120 determines phase information of the slave modem by using a time difference calculated by using the phase information of the master modem and the phase detection packet or pilot signal transmitted from the slave modem by the master modem.

Then, according to another embodiment, the DCU 120 detects a phase of a modem by accumulating in a manner that a ZCD signal is transmitted in a relay communication by using a ZCD time difference between phases on the basis of a ZCD point of a specific phase (Refer to FIG. 11).

In step S221, a modem transmits to a subsequent master modem an accumulated ZCD signal time difference of a previous section which is a result obtained by adding its own ZCD signal time difference with a ZCD signal time difference of a slave modem.

Then, in step S222, the DCU 120 determines phase information of a termination modem by using the accumulated ZCD signal time difference of the previous section.

Although preferred embodiments of the present invention have been described for illustrative purposes, those skilled in the art will appreciate that various modifications, additions and substitutions are possible, without departing from the scope and spirit of the invention as disclosed in the accompanying claims. Therefore, it will be understood that the present invention is not limited only to the form mentioned in the detailed description. Accordingly, the true technical protection scope of the present invention will be defined by the technical spirit of the appended claims. In addition, it should be appreciated that the present invention is intended to include all modifications and equivalents and alternatives falling within the spirit and scope of the invention as defined by the appended claims.

The invention claimed is:

1. An AMI system of performing phase detection and synchronization in an AMI communication network, the system comprising:
    an AMI server collecting a "reference zero-crossing detection (ZCD) time difference by phase" of input/output terminals of a main transformer installed in a substation; and
    a data concentration unit (DCU) comparing the "reference ZCD time difference by phase" transmitted from the AMI server with a "ZCD time difference by phase" collected by itself, and matching the ZCD time difference by phase with the reference ZCD time difference by phase to have a time difference close to an error range.

2. The AMI system of claim 1, wherein the ZCD time difference is determined by counting an interval between a "GPS PPS signal" that becomes a pulse counting basis, and a "ZCD pulse" as clock pulses.

3. The AMI system of claim 1, wherein the DCU includes:
an oscillator unit generating a clock pulse;
a GPS receiver unit determining a GPS pulse per second (PPS) signal from a received GPS signal;
a ZCD circuit unit connected to a secondary side of a pole transformer, and determining a ZCD pulse by phase; and
a pulse counting unit determining a ZCD time difference by phases by counting an interval between the GPS PPS signal and the ZCD pulse by phase as clock pulses.

4. The AMI system of claim 1, wherein the AMI server collects the "ZCD time difference by phase" by using a reference phase detection unit connected to the input/output terminals of the main transformer installed in the substation.

5. The AMI system of claim 1, wherein the DCU determines a phase of a master modem in a relay communication by using a ZCD time difference between phases on the basis of a ZCD point of a specific phase, and then determines a phase of a slave modem.

6. The AMI system of claim 5, wherein the DCU determines the phase of the master modem which directly performs communication without using a relay modem, and determines phase information of the slave modem by using "phase information of the master modem" and a time difference calculated from a phase detection packet transmitted from the slave modem by the master modem.

7. The AMI system of claim 1, wherein the DCU detects a phase of a modem by accumulating in manner that a ZCD signal is transmitted in a relay communication by using a ZCD time difference between phases on the basis of a ZCD point of a specific phase.

8. The AMI system of claim 7, wherein the modem transmits an accumulated ZCD signal time difference of a previous section which is a result obtained by adding a ZCD signal time difference obtained by itself and a ZCD signal time difference of a slave modem.

9. The AMI system of claim 7, wherein the DCU determines phase information of a termination modem by performing remainder arithmetic operation (MOD operation) that divides the accumulated ZCD signal time difference of the previous section transmitted from the modem by a total number of phases.

10. A method of performing phase detection and synchronization in an AMI communication network, the method comprising:
collecting, by an AMI server, a "ZCD time difference by phase" of input/output terminals of a main transformer installed in a substation;
collecting, by a DCU, a "ZCD time difference by phase" of the same timing as the ZCD time difference by phase of the input/output terminals; and
comparing, by the DCU, the "ZCD time difference by phase" transmitted from the AMI server with the "ZCD time difference by phase" collected by itself, and matching the ZCD time difference by phase collected by itself with the transmitted ZCD time difference by phase to have a time difference close to an error range.

11. The method of claim 10, wherein further comprising:
after the performing of the matching,
determining, by the DCU, phase information of a master modem that is directly connected thereto without using a relay modem; and
determining, by the DCU, phase information of a slave modem by using the "phase information of the master modem" and a time difference calculated from a phase detection packet transmitted from a slave modem by the master modem.

12. The method of claim 10, wherein further comprising:
after the performing of the matching,
transmitting, by a modem, to a subsequent master modem an accumulated ZCD signal time difference of a previous section which is a result obtained by adding own ZCD signal time difference and a ZCD signal time difference of a slave modem; and
determining, by the DCU, phase information of a termination modem by using the accumulated ZCD signal time difference of the previous section.

13. The method of claim 10, wherein the ZCD time difference is determined by counting an interval between a "GPS PPS signal" that becomes a pulse counting basis and a "ZCD pulse" as clock pulses.

* * * * *